(12) United States Patent
Seyyedy

(10) Patent No.: US 6,265,775 B1
(45) Date of Patent: Jul. 24, 2001

(54) FLIP CHIP TECHNIQUE FOR CHIP ASSEMBLY

(75) Inventor: Mirmajid Seyyedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/392,153

(22) Filed: Sep. 8, 1999

Related U.S. Application Data

(62) Division of application No. 08/788,209, filed on Jan. 24, 1997.

(51) Int. Cl.[7] ............................ H01L 23/48; H01L 23/52; H01L 29/40
(52) U.S. Cl. ............................ 257/737; 257/777; 257/782
(58) Field of Search ...................................... 257/737, 738, 257/777, 782

(56) References Cited

U.S. PATENT DOCUMENTS

| | | |
|---|---|---|
| 4,612,083 | 9/1986 | Yasumoto et al. . |
| 4,818,728 | 4/1989 | Rai et al. . |
| 5,097,232 | 3/1992 | Stopper . |
| 5,258,577 | 11/1993 | Clements . |
| 5,270,261 | * 12/1993 | Bertin et al. . |
| 5,329,423 | 7/1994 | Scholz . |
| 5,336,649 | 8/1994 | Kinsman et al. . |
| 5,341,564 | 8/1994 | Akhavain et al. . |
| 5,350,604 | * 9/1994 | Crivello . |
| 5,367,765 | 11/1994 | Kusaka . |
| 5,468,681 | 11/1995 | Pasch . |
| 5,468,995 | 11/1995 | Higgins, III . |
| 5,477,086 | 12/1995 | Rostoker et al. . |
| 5,770,480 | * 6/1998 | Ma et al. . |

* cited by examiner

Primary Examiner—David E. Graybill
(74) Attorney, Agent, or Firm—TraskBritt

(57) ABSTRACT

A 09/392153 substrate, such as flip-chip type semiconductor die, connected to an opposing substrate, such as a silicon wafer, printed circuit board, or other substrate, Each substrate has a plurality of conductive bumps on its facing surface wherein the conductive bumps on each substrate are the mirror-image of the other substrate. The substrates are attached to one another in a manner in which the conductive bumps on one substrate form an electrical contact with its respective conductive bumps on the opposing substrate without mechanical attachment.

20 Claims, 3 Drawing Sheets

FLIP CHIP TECHNIQUE FOR CHIP ASSEMBLY

CROSS REFERENCE TO RELATED APPLICATION

This application is a divisional of application Ser. No. 08/788,209, filed Jan. 24, 1997, pending.

BACKGROUND OF THE INVENTION

1. Field of the Invention

The present invention relates to an apparatus and a method for connecting one substrate, such as a flip-chip type semiconductor die, to another substrate, such as a silicon wafer, printed circuit board, or other substrate (hereinafter referred to generally as a "substrate"). More particularly, the present invention relates to a semiconductor die having a raised bond pad attached to a substrate which also has raised bond pads aligned to make electrical contact with the die bond pad without attachment.

2. State of the Art

A flip chip is a semiconductor chip or die that has bumped terminations spaced around the active surface of the die and is intended for face-to-face attachment to a substrate or another semiconductor die. The bumped terminations of the flip chips are usually a "Ball Grid Array" ("BGA") configuration wherein an array of minute solder balls is disposed on an attachment surface of a semiconductor die, or a "Slightly Larger than Integrated Circuit Carrier" ("SLICC") configuration wherein an array of minute solder balls is disposed on an attachment surface of a semiconductor die similar to a BGA, but having a smaller solder ball pitch and diameter than a BGA.

The attachment of a flip chip to a substrate or another semiconductor involves aligning the solder balls on the flip chip with a plurality of contact points (configured to be a mirror image of the solder ball arrangement on the flip chip) on a facing surface of the substrate. A plurality of solder balls may also be formed on a facing surface of the substrate at the contact points. A quantity of liquid flux is often applied to the face of the chip and/or substrate, and the chip and substrate are subjected to elevated temperature to effect refluxing or soldering of the solder balls on the chip and/or corresponding solder balls on the substrate.

There are numerous variations to the standard flip chip attachment technique. For example, U.S. Pat. No 5,329,423 issued July 12, 1994 to Scholz relates to demountable flip chip assembly comprising a first substrate having a contact site with a raised bump and a second substrate having a depression for a contact site. The raised bumps are pressed into the depressed areas to electrically and mechanically connect the first substrate to the second substrate without using reflowed solder. Thus, the first substrate can be removed from the second substrate without damaging either substrate.

U.S. Pat. No. 5,477,086 issued Dec. 19, 1995 to Rostoker et al. relates to a flip chip attachment technique involving forming a concave conductive bump on one substrate (such as the PCB) to receive and align the solder balls on the other substrate (such as the semiconductor die). The solder balls and/or the concave conductive bump are reflowed to fuse them together.

It is also known in the art that conductive polymers or resins can be utilized in place of solder balls. U.S. Pat. No. 5,258,577 issued Nov. 2, 1993 to Clements relates to a substrate and a semiconductor die with a discontinuous passivation layer. The discontinuities result in vias aligned with the contact points between the substrate and the semiconductor die. A resin with spaced conductive metal particles suspended therein is disposed within the vias to achieve electrical contact between the substrate and the semiconductor die. U.S. Pat. No. 5,468,681 issued Nov. 21, 1995 to Pasch relates to interconnecting conductive substrates using an interposer having conductive plastic filled vias.

Such flip chip and substrate attachments (collectively "electronic packages") are generally comprised of dissimilar materials that expand at different rates on heating. The most severe stress is due to the inherently large thermal coefficient of expansion ("TCE") mismatch between the plastic and the metal. These electronic packages are subject to two types of heat exposures: process cycles, which are often high in temperature but few in number; and operation cycles, which are numerous but less extreme. If either the flip chip(s) and/or substrate(s) are unable to repeatedly bear their share of the system thermal mismatch over its lifetime, the electronic package will fracture, thereby destroying the functionality of the electronic package.

As an electronic package dissipates heat to its surroundings during operation, or as the ambient system temperature changes, differential thermal expansions cause stresses to be generated in the interconnection structure (solder ball bonds) between the semiconductor die and the substrate These stresses produce instantaneous elastic and, most often, plastic strain, as well as time-dependent (plastic and anelastic) strains in the interconnection structure, particularly at the weakest interconnection structure. Thus, the thermal expansion mismatch between chip and substrate will cause a shear displacement to be applied on each terminal which can fracture the solder connection.

The problems associated with thermal expansion match are also applicable to connections made with conductive polymers or resins. After curing, the polymers or resins become substantially rigid. The rigid connections are equally susceptible to breakage due to thermal expansion mismatch.

Therefore, it would be advantageous to develop an apparatus for connecting a first semiconductor die or substrate to a second semiconductor die or substrate in such a manner that electrical contact is made at the contact points but no mechanical attachment occurs at the contact point. Such a connection would eliminate the possibility of fractures occurring at the contact points.

SUMMARY OF THE INVENTION

The present invention relates to an apparatus and a technique for coimecting a first substrate to a second substrate wherein the first substrate has a plurality of raised bond pads which make electrical contact (without attachment) with a plurality of raised bond pads on the second substrate.

A preferred method for constructing the apparatus of the present invention comprises providing a first substrate having a plurality of leads on an active surface or within the first substrate. A plurality of conductive bumps which contacts the leads is formed on the active surface of the first substrate. The conductive bumps are preferably metallic, such as copper, aluminum, or the like, and are formed by any number of known industry techniques, such as photolithography (subtractive or additive etching), liquid photoresist, dry-film photoresist, silk screening, or the like. The conductive bumps are also preferably flat on an upper surface of the conductive bumps.

A silicon wafer is preferred as the first substrate because the silicon wafer is usually very smooth and planar due to the chemical mechanical polishing (planarizing) or "CMP" step in silicon wafer production. A smooth and planar surface is preferred so that the conductive bumps are of even height across the silicon wafer.

A second substrate is provided which preferably also has a plurality of leads on an active surface or within the second substrate. A plurality of conductive bumps which contacts the leads is formed on the active surface of the second substrate in the same maimer as described for the first substrate. The conductive bumps are preferably the same metallic material as the first substrate conductive bumps or at least a very similar metallic material. The conductive bumps are also preferably flat on a facing surface of the conductive bumps.

The second substrate is preferably a flip chip, such as a memory chip, a CPU, or a logic chip. Flip chips are Generally manufactured with a plurality of bond pads on an active surface wherein each bond pad is connected to a lead. A facing surface of each bond pad has the conductive bump formed thereon.

A passivation layer is applied over the second substrate active surface. The passivation is preferably thicker than the height of the second substrate conductive bumps. The passivation layer is etched by any known industry standard technique to form vias to expose an active surface of the second substrate conductive bump. It is, of course understood that, rather than etching the passivation layer, a masking technique could be employed, such as a silk screen, over the semiconductor die conductive pad facing surface when the applying the passivation layer.

The apparatus of the present invention is completed by attaching the first substrate to the second substrate. The first substrate conductive bumps and the second substrate conductive bumps are aligned to be the mirror-image of one another, such that when the one substrate is flipped to attach to the other substrate component, each first substrate conductive bump contacts its respective second substrate conductive bump. A layer of adhesive is disposed between the passivation layer and the first substrate upper surface. When the first substrate is attached to the second substrate, an upper surface of the first substrate conductive bump and the second substrate conductive bump upper surface come into electrical communication without being mechanically attached to one another. The layer of adhesive may be eliminated if a glob top or encapsulant is used to secure or encase the apparatus. It is, of course, understood that the passivation layer could be applied to the first substrate active surface etched, and adhered to the second substrate active surface.

Thus with no mechanical attachment between the conductive bumps of the first substrate and the conductive bumps of the second substrate, thermal expansion will simply cause the conductive bumps to shift from side to side as the substrates expand or contract without losing electrical contact with one another. The preferred flat upper surfaces of both the first substrate conductive bumps and the second substrate conductive bumps maximize the potential contact surface of the conductive bumps as the substrates expand or contract.

During the assembly process, it is preferable to test the electrical contact of the conductive bumps between the first substrate and the second substrate while the adhesive is curing to fine tune for the best position and assure the functionality of the apparatus before the adhesive sets. When using a glob top or encapsulant, the electrical contact of conductive bumps should be tested prior to the application of the glob top or encapsulant.

Grooves on the facing surface of the first substrate and/or second substrate may be provided to assist in preventing or minimizing the movement of the substrates in relation to one another due to thermal expansion or other mechanical causes.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
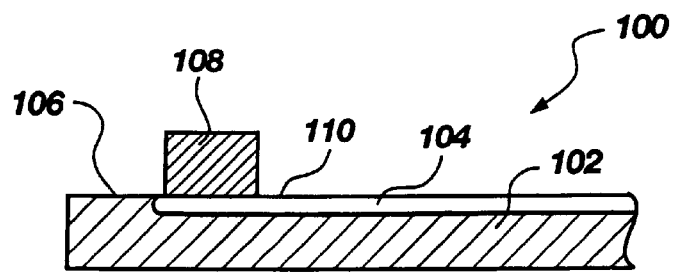
FIG. 1 is a side cross-sectional view of a first substrate component of the present invention.

FIG. 1 illustrates a first substrate component 100 of the present invention. The first substrate component 100 comprises a first substrate 102 having a plurality of leads 104 on a facing surface 106 of the first substrate 102. A conductive pad 108 is formed on a facing surface 110 of at least one substrate lead 104.

Figure 2:
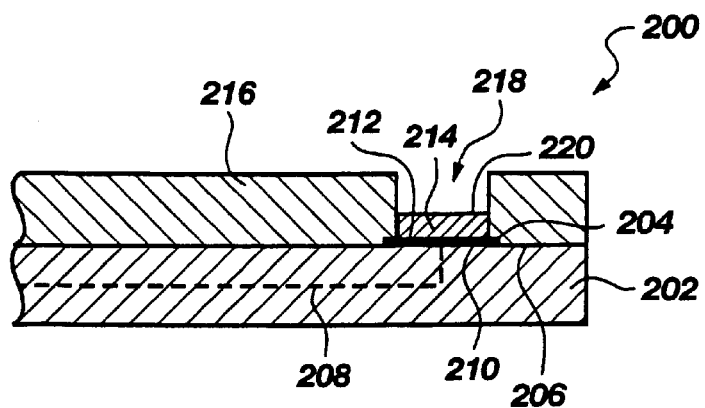
FIG. 2 is a side cross-sectional view of a second substrate component of the present invention.

FIG. 2 illustrates a second substrate or flip-chip component 200 of the present invention. The flip-chip component 200 comprises a second substrate or semiconductor die 202 having a plurality of bond pads 204 on a facing surface 206 of the semiconductor die 202. Each bond pad 204 is connected to a trace lead 208 (shown by a dashed line) on a lower bond pad surface 210. A facing surface 212 of each bond pad 204 has a conductive pad 214 formed thereon. A passivation layer 216 is applied over the semiconductor die facing surface 206. The passivation layer 216 is etched by any known industry standard technique to form vias 218 to expose a facing surface 220 of the semiconductor die conductive pad 214. It is, of course understood that, rather than etching the passivation layer 216, a masking technique could be employed, such as a silk screen, over the semiconductor die conductive pad facing surface 220 when applying the passivation layer 216.

Figure 3:
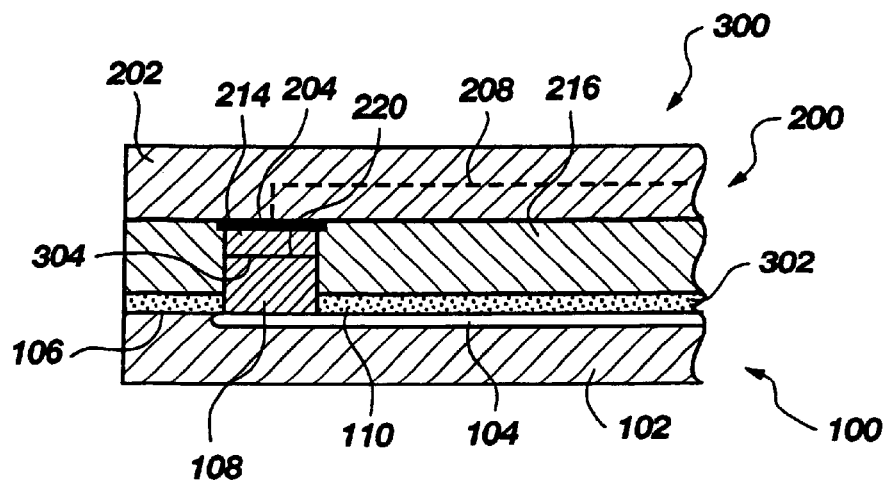
FIG. 3 is a side cross-sectional view of a first substrate/second substrate assembly of the present invention.

FIG. 3 illustrates a first substrate/second substrate assembly 300 of the present invention. The first substrate/second substrate assmebly 300 is a combination of the first substrate component 100 of FIG. 1 and the second substrate or flip-chip component 200 of FIG. 2; therefore, components common to FIGS. 1, 2, and 3 retain the same numeric designation. The substrate conductive pads 108 and the semiconductor die conductive pads 214 are aligned to be the mirror-image of one another, such that when the flip-chip component 200 is flipped to attach to the first substrate component 100, each substrate conductive pad 108 contacts its respective semiconductor die conductive pad 214. Thus, the substrate/flip-chip assembly 200 is constructed by flipping the flip-chip component 200 and attaching the flip-chip component 200 to the first substrate component 100. A layer of adhesive 302 is disposed between the passivation layer 216 and the first substrate facing surface 106. When the flip-chip component 200 is attached to the first substrate component 100, a facing surface 304 of the first substrate conductive pad 108 and the semiconductor die conductive pad facing surface 220 come into electrical communication without being attached to one another. It is, of course, understood that the passivation layer could be applied to the first substrate active surface, etched, and adhered to the second substrate active surface.

Figure 4:
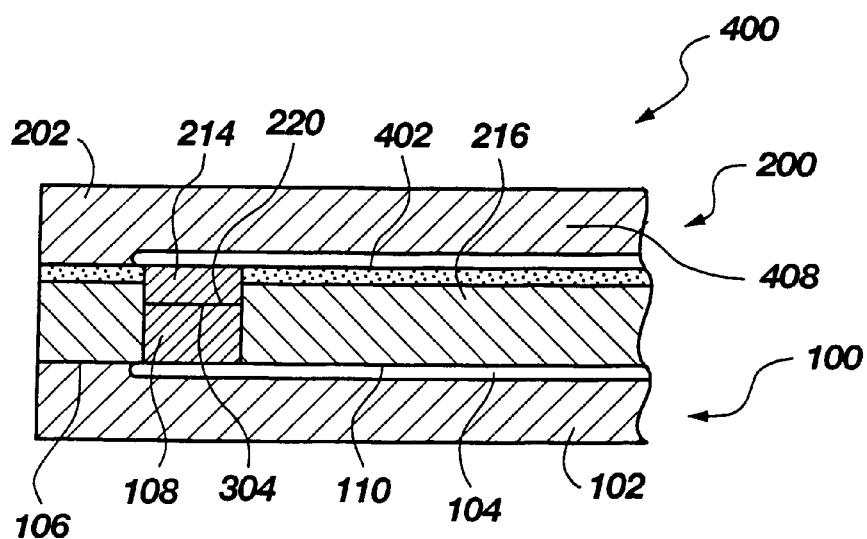
FIG. 4 is a side cross-sectional view of a first alternative first substrate/second substrate assembly of the present invention.

FIG. 4 illustrates a first alternative first substrate/second substrate assembly 400 of the present invention. The first alternate first substrate/second substrate assembly 400 is similar to the first substrate/second substrate assembly 300 of FIG. 3; therefore, components common to FIG. 3 and FIG. 4 retain the same numeric designation. The first alternative first substrate/second substrate assembly 400 differs from the first substrate/second substrate assembly 300 in that the second substrate pr flip-chip component 200 is specifically with a substrate with the conductive pad 214 formed on a substrate lead 402, rather than on a flip chip type bond pad 204 connected to a trace lead 208 shown in FIG. 3. The first alternative first substrate/second substrate assembly 400 also differs from the first substrate/second substrate assembly 300 in that the passivation layer 216 is first applied to first substrate facing surface 106, then a layer of adhesve 402 is disposed between the passivation layer 216 and the secons substrate 202.

Figure 5:
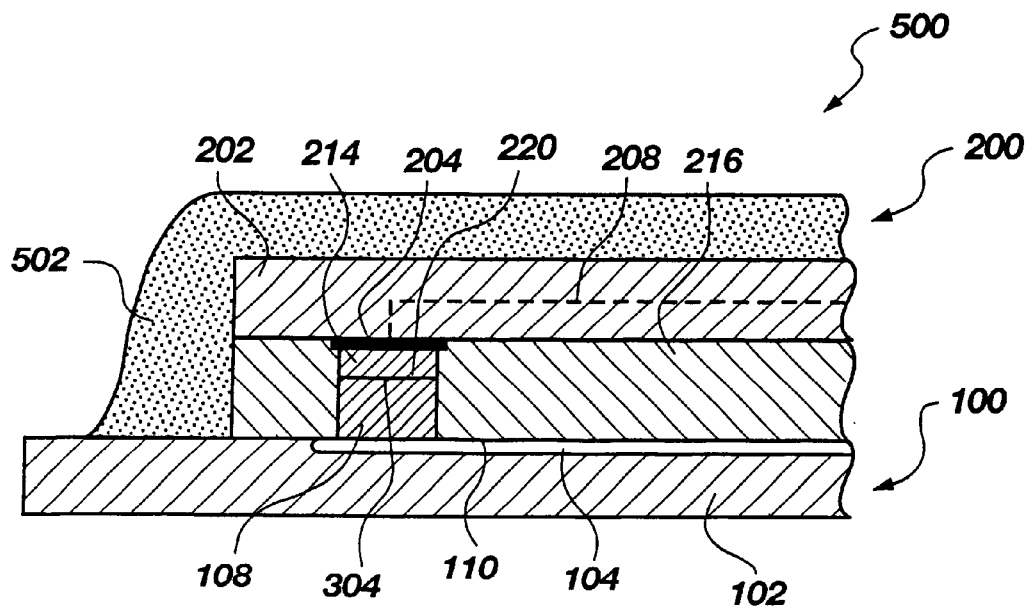
FIG. 5 is a side cross-sectional view of a second alternative first substrate/second substrate assembly of the present invention.

FIG. 5 illustrates a second alternative first substrate/second substrate assembly 500 of the present invention. The second alternate first substrate/second substrate assembly 500 is similar to the first substrate/second substrate assembly 300 of FIG. 3; therefore, components common to FIG. 3 and FIG. 5 retain the same numeric designation. The second alternative first substrate/second substrate assembly 500 differs from the first substrate/second substrate assembly 300 in that a glob top material 502 is used to attach the second substrate or flip-chip component 200 to the first substrate component 100, rather than using the layer of adhesive 302 shown in FIG. 3.

Figure 6:
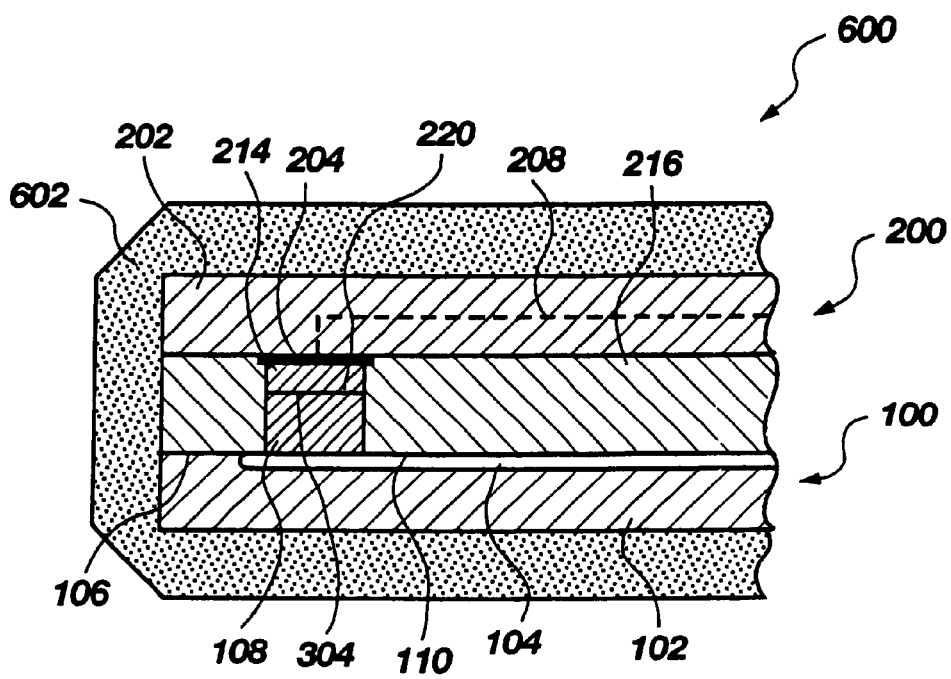
FIG. 6 is a side cross-sectional view of a third alternative first substrate/second substrate assembly of the present invention.

FIG. 6 illustrates a third alternative first substrate/second substrate assembly 600 of the present invention. The third alternate first substrate/second substrate assembly 600 is similar to the first substrate/second substrate assembly 300 of FIG. 3; therefore, components common to FIG. 3 and FIG. 6 retain the same numeric designation. The third alternative first substrate/second substrate assembly 600 differs from the first substrate/second substrate assembly 300 in that an encapsulant material 602 is used to substantially encase and attach the second substrate or flip-chip component 200 together with the first substrate component 100, rather than using the layer of adhesive 302 shown in FIG.3.

Figure 7:
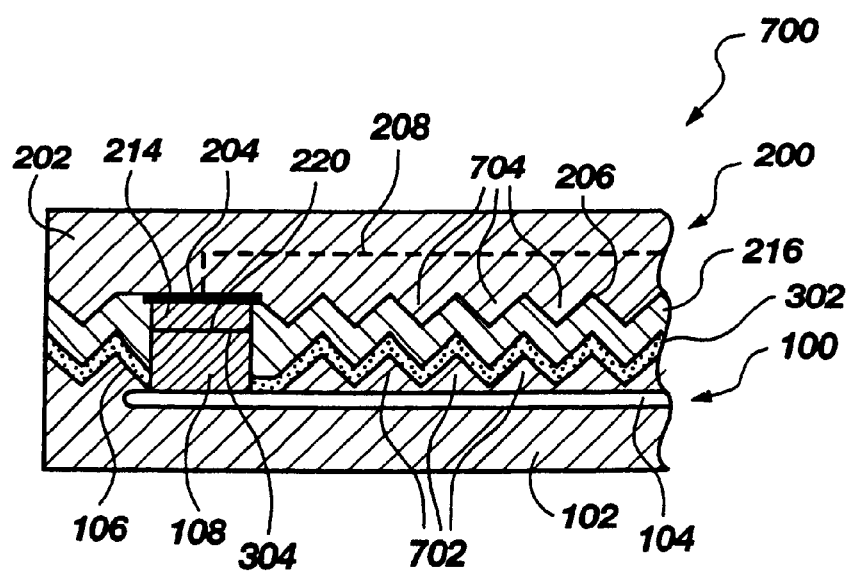
FIG. 7 is a side cross-sectional view of a fourth alternative first substrate/second substrate assembly of the present invention.

FIG. 7 illustrates a fourth alternative first substrate/second substrate assembly 700 of the present invention. The fourth alternate first substrate/second substrate assembly 700 is similar to the first substrate/second substrate assembly 300 of FIG. 3; therefore, components common to FIG. 3 and FIG. 7 retain the same numeric designation. The fourth alternative first substrate/second substrate assembly 700 differs from the first substrate/second substrate assembly 300 in that a first plurality of grooves 702 is disposed on the facing surface 106 of the first substrate 102 and a second plurality of grooves 704 is disposed on the facing surface 206 of the second substrate 202 wherein the first plurality of grooves 702 intermesh with the second plurality of grooves 704 to assist in preventing or minimizing the movement of first substrate 102 and/or second substrate 202 due to thermal expansion or other mechanical causes.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor assembly comprising:

a first substrate having at least one lead on a facing surface thereof, said at least one lead having at least one conductive pad disposed thereon, said at least one conductive pad having an upper surface, having a thickness and extending above the facing surface of said first substrate the thickness of said at least one conductive pad, said first substrate having a passivation layer disposed on said facing surface of said first substrate having a thickness greater than the thickness of said at least one conductive pad, said passivation layer having at least one via therein, said at least one conductive pad extending into and through only a portion of said via, and said first substrate having a layer of adhesive covering at least a portion of said passivation layer on said facing surface, said layer of adhesive having a thickness; and a second substrate having at least one lead on a facing surface thereof, said at least one lead of said second substrate having at least one conductive pad disposed thereon, said at least one conductive pad of said second substrate having an upper surface, a thickness and extending above the facing surface of said second substrate, the thickness of said at least one conductive pad of said second substrate being at least the combined thickness of the layer of adhesive covering at least a portion of said passivation layer on said facing surface of said first substrate and the remaining portion of the via having said at least one conductive pad of said first substrate extending there into of the thickness of the passivation layer on said facing surface of said first substrate, said second substrate being attached to said first substrate by said adhesive layer of said first substrate, said second substrate having the upper surface of said at least one conductive pad on said at least one lead of said first substrate substantially forming moveable, electrical contact without mechanical attachment with the upper surface of said at least one conductive pad on said at least one lead of said second substrate, said moveable, electrical contact provided when said second substrate is permanently attached to said first substrate by said layer of adhesive.

2. A semiconductor assembly comprising:

a first substrate having at least one lead on a facing surface thereof, said at least one lead having at least one conductive pad disposed thereon, said at least one conductive pad having an upper surface, having a thickness and extending above the facing surface of said first substrate the thickness of said at least one conductive pad, said first substrate having a passivation layer disposed on said facing surface of said first substrate having a thickness greater than the thickness of said at least one conductive pad, said passivation layer having at least one via therein, said at least one conductive pad extending into and through only a portion of said via; and a second substrate having at least one lead on a facing surface thereof, said at least one lead of said second substrate having at least one conductive pad disposed thereon, said at least one conductive pad of said second substrate having an upper surface, a thickness and extending above the facing surface of said second substrate, the thickness of said at least one conductive pad of said second substrate being at least the thickness of the remaining portion of the via having said at least one conductive pad of said first substrate extending there into of the thickness of the passivation layer on said facing surface of said first substrate, said first substrate being attached to said second substrate by an encapsulation material substantially surrounding said first substrate and said second substrate, said second substrate having the upper surface of said at least one conductive pad on said at least one lead of said first substrate substantially forming moveable, electrical contact without mechanical attachment with the upper surface of said at least one conductive pad on said at least one lead of said second substrate.

3. The semiconductor assembly of claim 1, wherein at least one of said first substrate facing surface and said second substrate facing surface includes at least one groove thereon.

4. The semiconductor assembly of claim 1, wherein at least one of said first substrate and said second substrate comprises a flip chip.

5. The semiconductor assembly of claim 1, wherein at least one of said first substrate and said second substrate comprises a silicon wafer.

6. A semiconductor assembly comprising:

a first substrate having at least one lead on a first side thereof, said at least one lead having at least one conductive pad disposed thereon having a substantially flat surface thereon, having a thickness and extending above the facing surface of said first substrate the thickness of said at least one conductive pad, said first substrate having a passivation layer disposed on said facing surface of said second substrate having a thickness greater than the thickness of said at least one conductive pad, said passivation layer having at least one via therein, said at least one conductive pad extending into and through only a portion of said via, and said first substrate having a layer of adhesive covering at least a portion of said passivation layer on said facing surface, said layer of adhesive having a thickness; and a second substrate having at least one lead on a first side thereof, said at least one lead of said second substrate having at least one conductive pad disposed thereon, said at least one conductive pad of said second substrate having a substantially flat surface thereon, a thickness and extending above the facing surface of said second substrate, the thickness of said at least one conductive pad of said second substrate being at least the combined thickness of the layer of adhesive covering at least a portion of said passivation layer on said facing surface of said first substrate and the remaining portion of the via having said at least one conductive pad of said first substrate extending there into of the thickness of the passivation layer on said facing surface of said first substrate, said second substrate being juxtaposed to said first substrate by said layer of adhesive, said first substrate having said substantially flat surface of said at least one conductive pad on said at least one lead of said first substrate forming moveable, electrical contact without mechanical attachment with said substantially flat surface of said at least one conductive pad on said at least one lead of said second substrate, said moveable, electrical contact provided when said second substrate is permanently juxtaposed to said first substrate by said layer of adhesive.

7. A semiconductor assembly comprising:

a first substrate having at least one lead on a facing surface thereof, said at least one lead having at least one conductive pad disposed thereon, said at least one conductive pad having an upper surface, having a thickness and extending above the facing surface of said first substrate the thickness of said at least one conductive pad, said first substrate having a passivation layer disposed on said facing surface of said first substrate having a thickness greater than the thickness of said at least one conductive pad, said passivation layer having at least one via therein, said at least one conductive pad extending into and through only a portion of said via; and a second substrate having at least one lead on a facing surface thereof, said at least one lead of said second substrate having at least one conductive pad disposed thereon, said at least one conductive pad of said second substrate having an upper surface, a thickness and extending above the facing surface of said second substrate, the thickness of said at least one conductive pad of said second substrate being at least the thickness of the remaining portion of the via having said at least one conductive pad of said first substrate extending there into of the thickness of the passivation layer on said facing surface of said first substrate, wherein one of said first substrate or said second substrate being attached to the other one of said first substrate or said second substrate by a glob top covering said one substrate and adhering to at least a portion of the facing surface of said other substrate, said second substrate having the upper surface of said at least one conductive pad on said at least one lead of said first substrate substantially forming moveable, electrical contact without mechanical attachment with the upper surface of said at least one conductive pad on said at least one lead of said second substrate, said moveable, electrical contact provided when said second substrate is permanently attached to said first substrate by said glob top.

8. A semiconductor assembly comprising:

a first substrate having at least one lead on a first side thereof, said at least one lead having at least one conductive pad disposed thereon having a substantially flat surface thereon, having a thickness and extending above the facing surface of said first substrate the thickness of said at least one conductive pad, said first substrate having a passivation layer disposed on said facing surface of said second substrate having a thickness greater than the thickness of said at least one conductive pad, said passivation layer having at least one via therein, said at least one conductive pad extending into and through only a portion of said via; and a second substrate having at least one lead on a first side thereof, said at least one lead of said second substrate having at least one conductive pad disposed thereon, said at least one conductive pad of said second substrate having a substantially flat surface thereon, a thickness and extending above the facing surface of said first substrate, the thickness of said at least one conductive pad of said second substrate being at least the thickness of remaining portion of the via having said at least one conductive pad of said first substrate extending there into of the thickness of the passivation layer on said facing surface of said first substrate, said second substrate is juxtaposed to said first substrate having said substantially flat surface of said at least one conductive pad on said at least one lead of said first substrate substantially movably, electrically contacts without mechanical attachment said substantially flat surface of said at least one conductive pad on said at least one lead of said second substrate substantially making electrical contact therewith, said first substrate being attached to said second substrate by an encapsulation material substantially surrounding said first substrate and said second substrate.

9. The semiconductor assembly of claim 6, wherein at least one of said first surface of said first substrate and said first surface of said second substrate includes at least one groove thereon.

10. The semiconductor assembly of claim 6, wherein at least one of said first substrate and said second substrate comprises a flip chip.

11. The semiconductor assembly of claim 6, wherein at least one of said first substrate and said second substrate comprises a silicon wafer.

12. A semiconductor assembly, comprising:

a first substrate having a plurality of leads on a first side thereof, each lead of said plurality of leads having a conductive pad disposed thereon disposed in substantially a horizontal plane, each pad having a substantially flat surface disposed in said substantially horizontal plane thereon, having a thickness and extending above the facing surface of said first substrate the thickness of said at least one conductive pad, said first substrate having a passivation layer disposed on said facing surface of said first substrate having a thickness greater than the thickness of said pad, said passivation layer having at least one via therein for each said pad, each conductive pad extending into and through only a portion of said via, and said first substrate having a layer of adhesive covering at least a portion of said passivation layer on said facing surface, said layer of adhesive having a thickness; and a second substrate having a plurality of leads on a first side thereof, each lead of said plurality of leads of said second substrate having a conductive pad disposed thereon in substantially a horizontal plane, each conductive pad of said second substrate having a substantially flat surface disposed in said substantially horizontal plane thereon, a thickness and extending above the facing surface of said second substrate, the thickness of said conductive pad of said second substrate being at least the combined thickness of the layer of adhesive covering at least a portion of said passivation layer on said facing surface of said first substrate and the remaining portion of the via having said at least one conductive pad of said first substrate extending there into of the thickness of the passivation layer on said facing surface of said first substrate, said second substrate being juxtaposed to said first substrate by said layer of adhesive, said first substrate having at least one conductive pad located on at least one lead of said plurality of leads of said first substrate forming moveable, electrical contact without mechanical attachment with at least one conductive pad on at least one lead of said plurality of leads of said second substrate, said moveable, electrical contact provided when said second substrate is permanently attached to said first substrate by said layer of adhesive.

13. The semiconductor assembly of claim 12, wherein at least one of said first surface of said first substrate and said first surface of said second substrate includes at least one groove thereon.

14. The semiconductor assembly of claim 12, wherein at least one of said first substrate and said second substrate comprises a flip chip.

15. The semiconductor assembly of claim 12, wherein at least one of said first substrate and said second substrate comprises a silicon wafer.

16. A semiconductor assembly comprising:

a first silicon substrate having a plurality of leads on a first side thereof, each lead of said plurality of leads having a conductive pad disposed thereon in substantially a horizontal plane, each pad having a substantially flat surface disposed in said substantially horizontal plane thereon, having a thickness and extending above the facing surface of said first silicon substrate the thickness of said at least one conductive pad, said first silicon substrate having a passivation layer disposed on said facing surface of said first silicon substrate having a thickness greater than the thickness of said pad, said passivation layer having at least one via therein for each said pad, each conductive pad extending into and through only a portion of said via, and said first silicon substrate having a layer of adhesive covering at least a portion of said passivation layer on said facing surface, said layer of adhesive having a thickness; and a second silicon substrate having a plurality of leads on a first side thereof, each lead of said plurality of leads of said second silicon substrate having a conductive pad disposed thereon in substantially a horizontal plane, each conductive pad of said second silicon substrate having a substantially flat surface disposed in said substantially horizontal plane thereon, a thickness and extending above the facing surface of said second silicon substrate, the thickness of said conductive pad of said second silicon substrate being at least the combined thickness of the layer of adhesive covering at least a portion of said passivation layer on said facing surface of said first silicon substrate and the remaining portion of the via having said at least one conductive pad of said first silicon substrate extending there into of the thickness of the passivation layer on said facing surface of said first silicon substrate, said second silicon substrate being juxtaposed to said first silicon substrate by said layer of adhesive, said first silicon substrate having at least one of said conductive pad on at least one lead of said plurality of leads on said first silicon substrate forming moveable, electrical contact without mechanical attachment with at least one conductive pad on at least one lead of said plurality of leads of said second silicon substrate, said moveable, electrical contact provided when said second silicon substrate is permanently attached to said first silicon substrate by said layer of adhesive.

17. The semiconductor assembly of claim 16, wherein at least one of said first surface of said first silicon substrate and said first surface of said second silicon substrate includes at least one groove thereon.

18. The semiconductor assembly of claim 16, wherein at least one of said first silicon substrate and said second silicon substrate comprises a flip chip.

19. The semiconductor assembly of claim 16, wherein at least one of said first substrate and said second substrate comprises a silicon wafer.

20. A semiconductor assembly comprising:

a first substrate having at least one lead on a facing surface thereof, said at least one lead having at least one conductive pad disposed thereon, said at least one conductive pad having an upper surface, having a thickness and extending above the facing surface of said first substrate the thickness of said at least one conductive pad, said first substrate having a passivation layer disposed on said facing surface of said first substrate having a thickness greater than the thickness of said at least one conductive pad, said passivation layer having at least one via therein, said at least one conductive pad extending into and through only a portion of said via; and a second substrate having at least one lead on a facing surface thereof, said at least one lead of said second substrate having at least one conductive pad disposed thereon, said at least one conductive pad of said second substrate having an upper surface, a thickness and extending above the facing surface of said second substrate, the second substrate having a layer of adhesive having a thickness on at least a portion of said facing surface thereof, said second substrate being attached to said first substrate by said layer of adhesive of said second substrate, said second substrate having the upper surface of said at least one conductive pad on said at least one lead of said first substrate substantially forming moveable, electrical contact without mechanical attachment with the upper surface of said at least one conductive pad on said at least one lead of said second substrate, said moveable, electrical contact provided when said second substrate is permanently attached to said first substrate by said layer of adhesive.

* * * * *